United States Patent
Jordan et al.

(10) Patent No.: US 6,687,861 B1
(45) Date of Patent: Feb. 3, 2004

(54) MEMORY TESTER WITH ENHANCED POST DECODE

(75) Inventors: Stephen D Jordan, Ft Collins, CO (US); John M Freeseman, Fort Collins, CO (US); Samuel U Wong, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 342 days.

(21) Appl. No.: 09/702,631

(22) Filed: Oct. 31, 2000

(51) Int. Cl.[7] .............................................. G11C 29/00
(52) U.S. Cl. ...................................................... 714/718
(58) Field of Search .......................... 714/718, 37, 724, 714/3, 723

(56) References Cited

U.S. PATENT DOCUMENTS 5,610,925 A * 3/1997 Takahashi

* cited by examiner

Primary Examiner—Phung M. Chung
(74) Attorney, Agent, or Firm—Edward L. Miller

(57) ABSTRACT

The data path into a post decode mechanism is altered to allow post decode to process data before or as that data is placed into a destination memory structure in interior test memory. Other data will continue to be first placed into a memory structure in interior test memory before being applied to the post decode mechanism. Extensive masking capability coupled with copies of error tables allow incremental post decode analysis for a new test, and avoids counting of errors in locations that are already known to have failed during previous tests. Both errors within words and bit errors can be accumulated. The post decode mechanism is often capable of producing multiple type of results from a single pass through the data, whether applied on the fly or from a structure in interior test memory. The post decode mechanism has counters that count down from pre-loaded values representing thresholds for deciding something about error activity. A counts of zero produces a terminal count flag. The values of the various terminal count flags are available at any time as data to be logged in interior test memory. Counters are often reloaded with an initial count at the conclusion of one test phase and in preparation for a subsequent phase. Some overhead may be saved and utility added by arranging for the counters to have respective initial value registers from which they may be reloaded upon receipt of a single command. The presence of the terminal count flag for a counter can inhibit the reload of the counter from its initial value register.

2 Claims, 8 Drawing Sheets

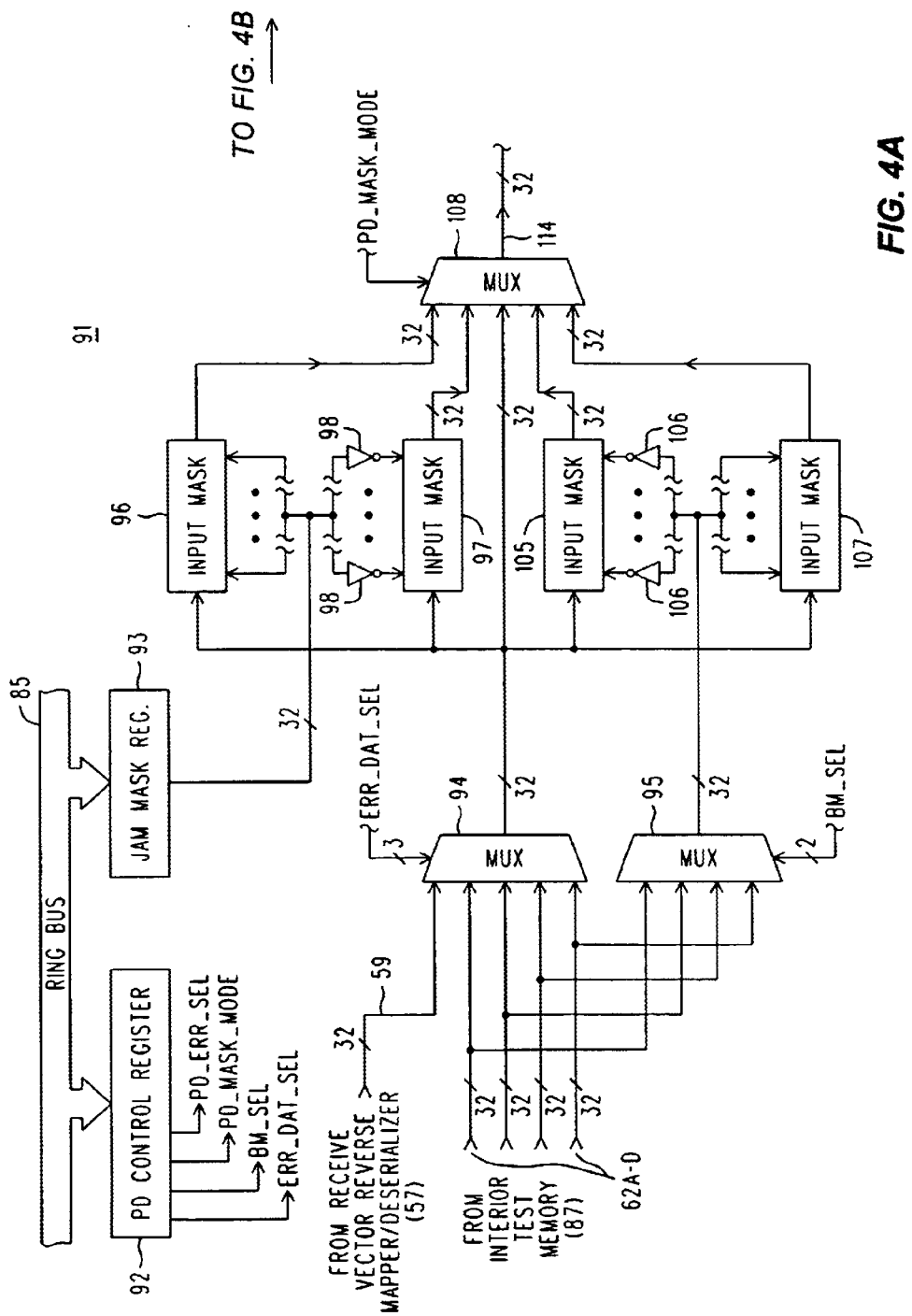

MEMORY TESTER WITH ENHANCED POST DECODE

REFERENCE TO RELATED APPLICATIONS

The subject matter of the instant Patent Application is related to that disclosed in a pending U.S. Patent Application entitled MEMORY TESTER HAS MEMORY SETS CONFIGURABLE FOR USE AS ERROR CATCH RAM, TAG RAM's, BUFFER MEMORIES AND STIMULUS LOG RAM, Ser. No. 09/672,650 and filed on Sep. 28, 2000. That disclosure describes an aspect of operations called Address Classification and Data Classification that are of interest herein. For that reason U.S. patent application Ser. No. 09/672,650 is hereby expressly incorporated herein by reference.

The Application incorporated above itself incorporates an application Ser. No. 09/665,892 and entitled ERROR CATCH RAM FOR MEMORY TESTER HAS SDRAM MEMORY SETS CONFIGURABLE FOR SIZE AND SPEED, filed Sep. 20, 2000. This latter Application has since issued on Nov. 20, 2001 as U.S. Pat. No. 6,320,812, and has an extensive description of the memory system utilized in the preferred embodiment described below, which although in principle is not essential, is nevertheless the present system of choice. Its attributes would be difficult to suppress from a description such as the one that follows; accordingly, U.S. Pat. No. 6,320,812 is also hereby expressly incorporated herein by reference.

BACKGROUND OF THE INVENTION

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. Memory testers frequently run continuously, and test time is considered a major factor in the cost of the final part. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and use logical methods to isolate portions of the pattern that do not perform as expected. A test pattern that is generated algorithmically using instructions and commands that are repeated in programming loops consume less space in tester memory. Accordingly, it is desirable to have algorithmic test pattern generation capability in a memory tester.

Precise signal edge placement and detection is also a consideration in the effectiveness of a non-volatile memory tester. In order to identify parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test (memory).

Memory testers are said to generate transmit vectors that are applied (stimulus) to the DUT (Device Under Test), and receive vectors that are expected in return (response). The algorithmic logic that generates these vectors can generally do so without troubling itself about how a particular bit in a vector is to get to or from a particular signal pad in the DUT, as the memory tester contains mapping arrangements to route signals to and from the pins that contact the DUT. The collection of the algorithmic pattern generation, threshold setting, signal conditioning and comparison mechanisms, and the probes that connect that stuff to the DUT, is called a test site. In the simple case there is one DUT per test site.

Memory testers have interior test memory that is used to facilitate the test process. This interior test memory may be used for several purposes, among which are storing transmit vectors ahead of time, as opposed to generating them in real time, storing expected receive vectors, and storing a variety of error indications and other information concerning DUT behavior obtained during testing. (There are also housekeeping purposes internal to the operation of the memory tester that use RAM and that may appear to fall within the purview of the phrase "interior memory." These are private to the internal operation of the tester, tend to not be visible at the algorithmic level, and are comparable to executable instruction stores and to internal control registers. That memory is described as "interior control memory," and is excluded from what is meant herein by the term "interior test memory," which we use to describe memory used to store bit patterns directly related to the stimulus of, and response from, the DUT.) It is easy to appreciate that this interior test memory needs to operate at least as fast as the tests being performed; a very common paradigm is for the interior test memory (or some portion thereof) to be addressed by the same address (or some derivative thereof) as is applied to the DUT. What is then stored at that addressed location in interior test memory is something indicative of DUT behavior during a test operation performed on the DUT at that address. Algorithmic considerations within the test program may mean that the sequence of addresses associated with consecutive transmit vectors can be arbitrary. Thus, the interior memory needs to have the dual attributes of high speed and random addressability. SRAM comes to mind immediately as being fast, easy to control and tolerant of totally random addressing. Indeed, conventional memory testers have used SRAM as their interior test memory.

Unfortunately, SRAM is quite expensive, and this has limited the amount of interior test memory with which memory testers have had to work. The result is limits on memory tester functionality that are imposed by a shortage of memory. DRAM is significantly less expensive, but cannot tolerate random addressing and still perform at high speed.

DRAM can replace SRAM as the interior test memory in a memory tester. As briefly described below, the problem of increasing the speed of DRAM operation for use as interior test memory can be solved by increasing the amount of DRAM used, in place of increasing its speed. Numbers of identical Banks of DRAM are treated as Groups. A combination of interleaving signals for different Banks of memory in a Group thereof and multiplexing between those Groups of Banks slows the memory traffic for any one Bank down to a rate that can be handled by the Bank.

At the top level of interior test memory organization there are four Memory Sets, each having its own separate and independent address space and performing requested memory transactions. Two are of SDRAM as described above, and two are of SRAM. Each Memory Set has its own controller to which memory transactions are directed. As to externally visible operational capabilities as memories, all four Memory Sets are essentially identical. They differ only in their size of memory space and how they are internally implemented: The SRAM Memory Sets do not employ multiplexing and interleaving, since they are fast enough to begin with. Despite their independence, Memory Sets of the same type (of SRAM or of DRAM) may be "stacked," which is to say treated a one larger address space.

Thus it is that the interior test memory of the tester is divided into four Memory Sets, two of which are "internal" SRAM's and two of which are "external" DRAM's. To be sure, all this memory is physically inside the memory tester; the terms "internal" and "external" have more to do with a level of integration. The SRAM's are integral parts of a VLSI (Very Large Scale Integration) circuit associated with the tester's central functional circuitry, while the DRAM's are individual packaged parts mounted adjacent the VLSI stuff. The amount of SRAM is fairly small, (say, around a megabit per Memory Set) while the amount of DRAM is substantial and selectable (say, in the range of 128 to 1024 megabits per Memory Set). The SRAM Memory Sets are always present, and may be used for any suitable purpose, such as storing the expected content of a DUT that is a ROM (Read Only Memory). The DRAM Memory Sets, although actually optional, are typically used for creating a trace for subsequent analysis leading to repair, although there are also other uses. The tester need not, in principle, enforce distinctions between the SRAM and DRAM Memory Sets, as to different purposes for which they may be used. There are some practical distinctions that arise mostly as a matter of size; the SRAM Memory Sets are small, while the DRAM Memory Sets are potentially huge. The person or persons creating the test programming generally make the decisions concerning how the various Memory Sets are to be used. There are, however, a few distinctions where a particular operational feature of the memory tester requires the use of a specific Memory Set. These cases usually arise out of economic or performance considerations that require a dedicated hardware path to a Memory Set. While these mechanisms could be generalized, it is expedient to simply pick a likely one, and let it go at that.

The advent of substantial amounts of interior test memory (in the form of the DRAM Memory Sets) raises the issue of how this additional amount of memory can be used to facilitate the operation of desirable features within the memory tester. In the tester of interest the interior test memory subsystem is extremely flexible, in that despite having a native word width of thirty-two bits, the effective word width can be any power of two (up to $2^5=32$), with a corresponding increase in address space for narrower words. There is an extensive address mapping capability, both for addressing DUT's and for addressing interior test memory, substantial data classification and address classification mechanisms that facilitate multiple Tag RAM's and other error analysis tools, all of which are made more practical by having lots of interior test memory. Moreover, these enhancements made possible by more memory do not exist in a vacuum; they are very valuable in the testing of certain types of memory parts.

It is conventional for a memory tester to have a capability called "post decode." The idea is that, after tests have been run on a DUT, the interior test memory, which may have been divided into several sections (variously organized as tables, lists, traces or "images" of events of interest), will contain data ready for inspection. For the most part, these inspections will be to discover indications of failure, and in the system of interest an indication of a failure is encoded by a zero. It is a bit of a simplification, but what is often needed, and what the Post Decode mechanism is frequently expected to do, is to tote up the number of 0's in some structure in interior test memory. Prior art memory testers have heretofore required that the test data be stored in some memory structure in interior test memory, such as in an Error Catch RAM, before being applied to the Post Decode mechanism.

Prior art memory testers with a post decode capability have been limited in ways that are presently perceived as causing increased test time. Manufacturers of high volume memory parts believe that "time on the tester is money" and are in favor of strategies that reduce test time. The advent of increased amounts of interior test memory, in conjunction with address and data classification techniques that allow the production of pluralities of "Tag RAM's" (tables whose entries have highly refined meanings, and are thus small in comparison with, say, a simple image of addresses versus error that is essentially equivalent in size to the DUT itself) have put conventional post decode techniques into the position of being a limiting factor for the task of reducing test time. This situation simply gets worse as memories (DUT's) get larger and internally more complex. The increased complexity means there are more memory structures (Tag RAM's, etc.) in interior test memory to apply to the post decode section, and the increased size of the DUT's means those memory structures are also larger; all of which adds up to increases in test time.

What can be done to make the operation of post decode faster and more efficient? And, are there new types of measurements that an enhanced post decode can do that add to the utility of the memory tester?

SUMMARY OF THE INVENTION

A number of things can be done to enhance the operation of post decode. In the preferred embodiment described below, the data path into the post decode section is altered to allow post decode to process suitable data "on the fly," as it were, before or as that data is placed into a destination memory structure in interior test memory. Other data will continue to be first placed into a memory structure in interior test memory before being applied to the post decode mechanism. Extensive masking capability coupled with copies of error tables allow incremental post decode analysis for a new test, and avoids counting of errors in locations that are already known to have failed during a previous test(s). Errors can be accumulated with differing scopes, or resolution; both errors within words and bit errors can be accumulated. The internal architecture of an enhanced post decode mechanism is often capable of producing multiple types of results from a single pass through the data, whether applied on the fly or from a structure in interior test memory. The post decode mechanism has many counters therein, and they count down from pre-loaded values representing thresholds for deciding something about error activity. When a counter counts down to zero it produces a terminal count flag. The values of the various terminal count flags are available at any time as data to be stored (their values logged) in a structure in interior test memory. Finally, it is often the case that each counter is reloaded with its initial count at the conclusion of one test phase and in preparation for a subsequent phase. Some overhead may be saved and utility added by arranging for the counters to have respective initial value registers from which they may be reloaded upon receipt of a single command, as opposed to having to send those various initial values all over again via a bus. In addition, it is desirable to arrange that the presence of the terminal count flag for a counter can inhibit the reload of the counter from its initial value register.

BRIEF DESCRIPTION OF THER DRAWINGS

Figure 2:
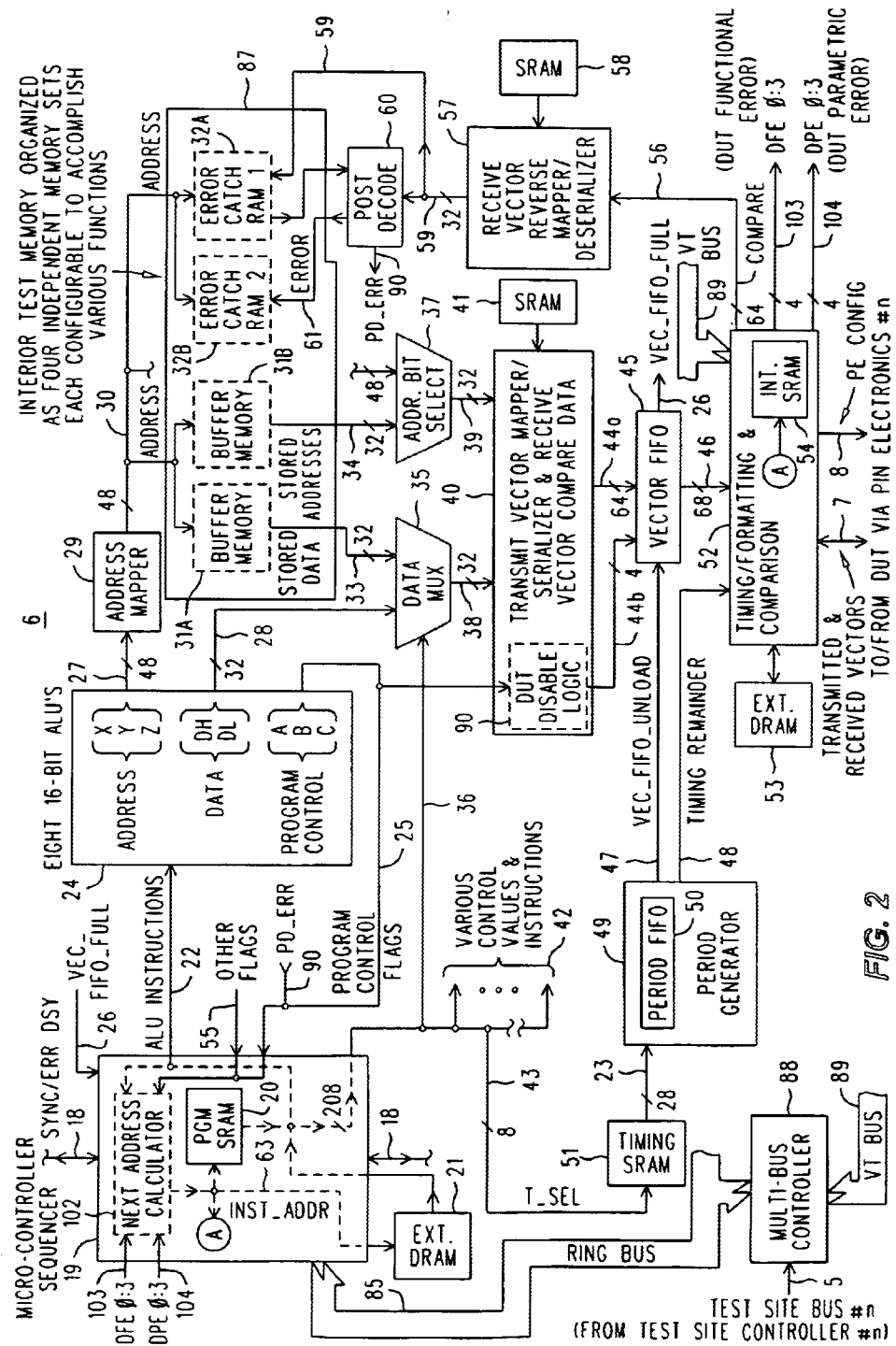
FIG. 2 is a simplified block diagram expansion of the DUT tester 6 of FIG. 1.
Figure 4B:
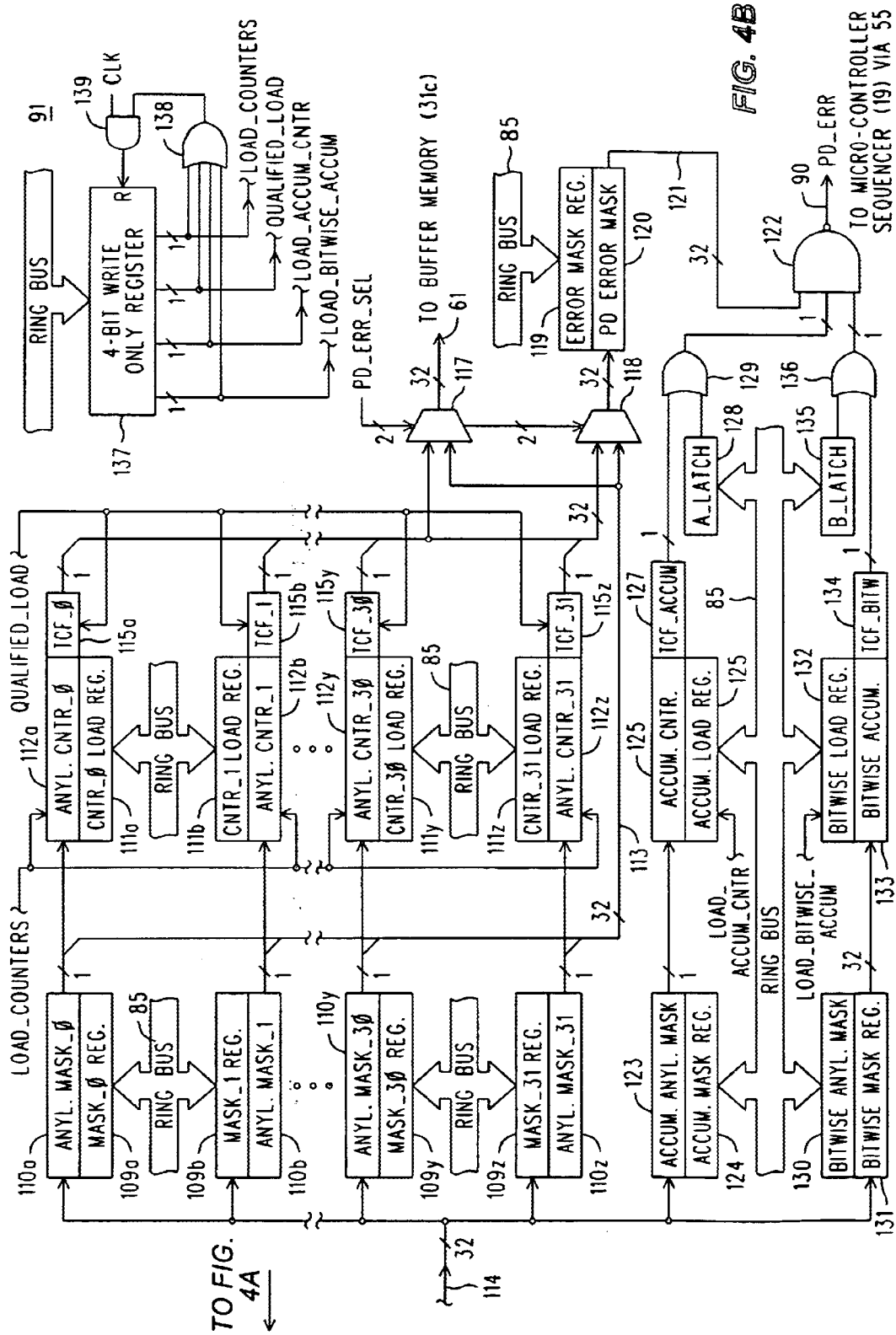
Figure 5:
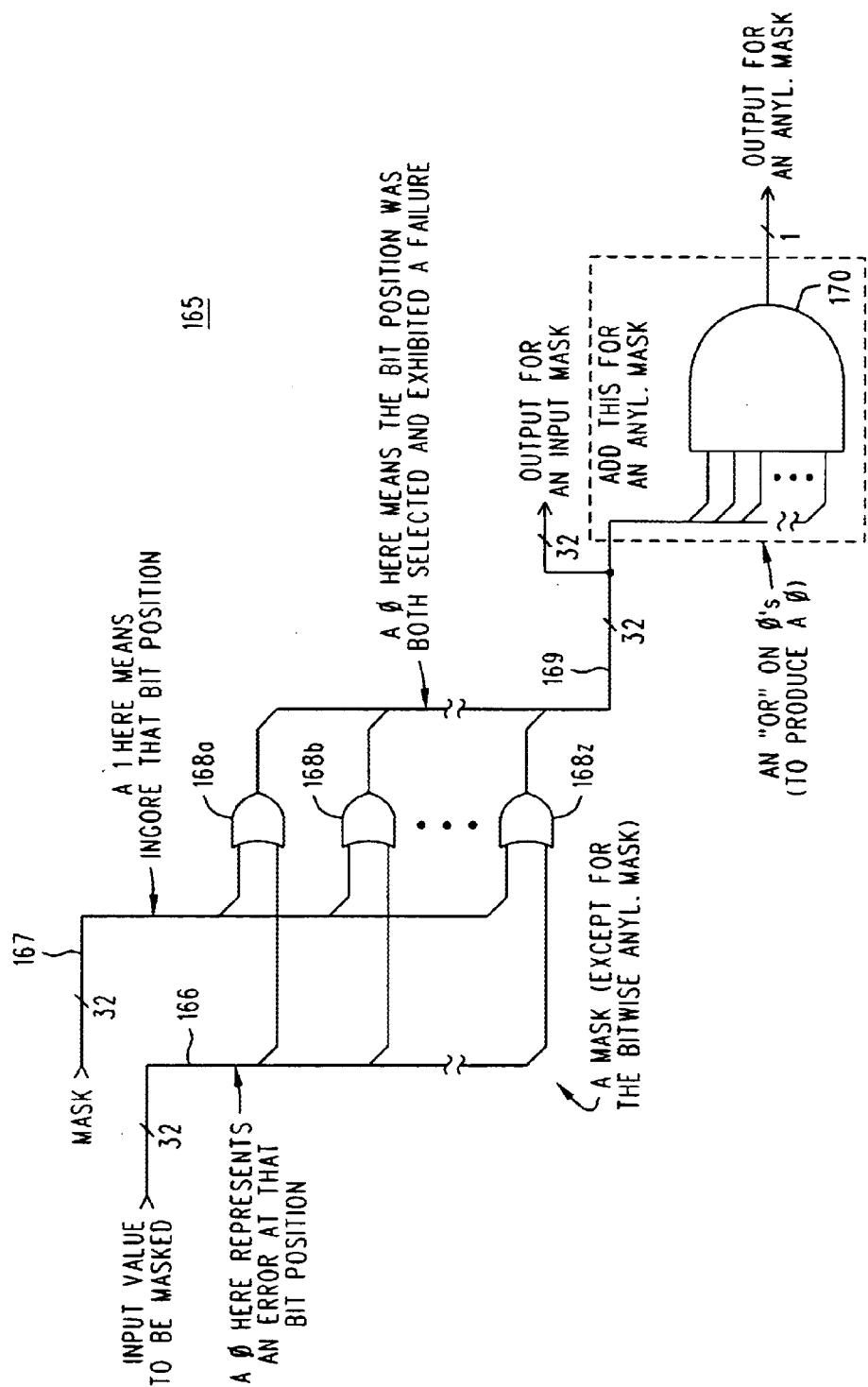
Figure 6:
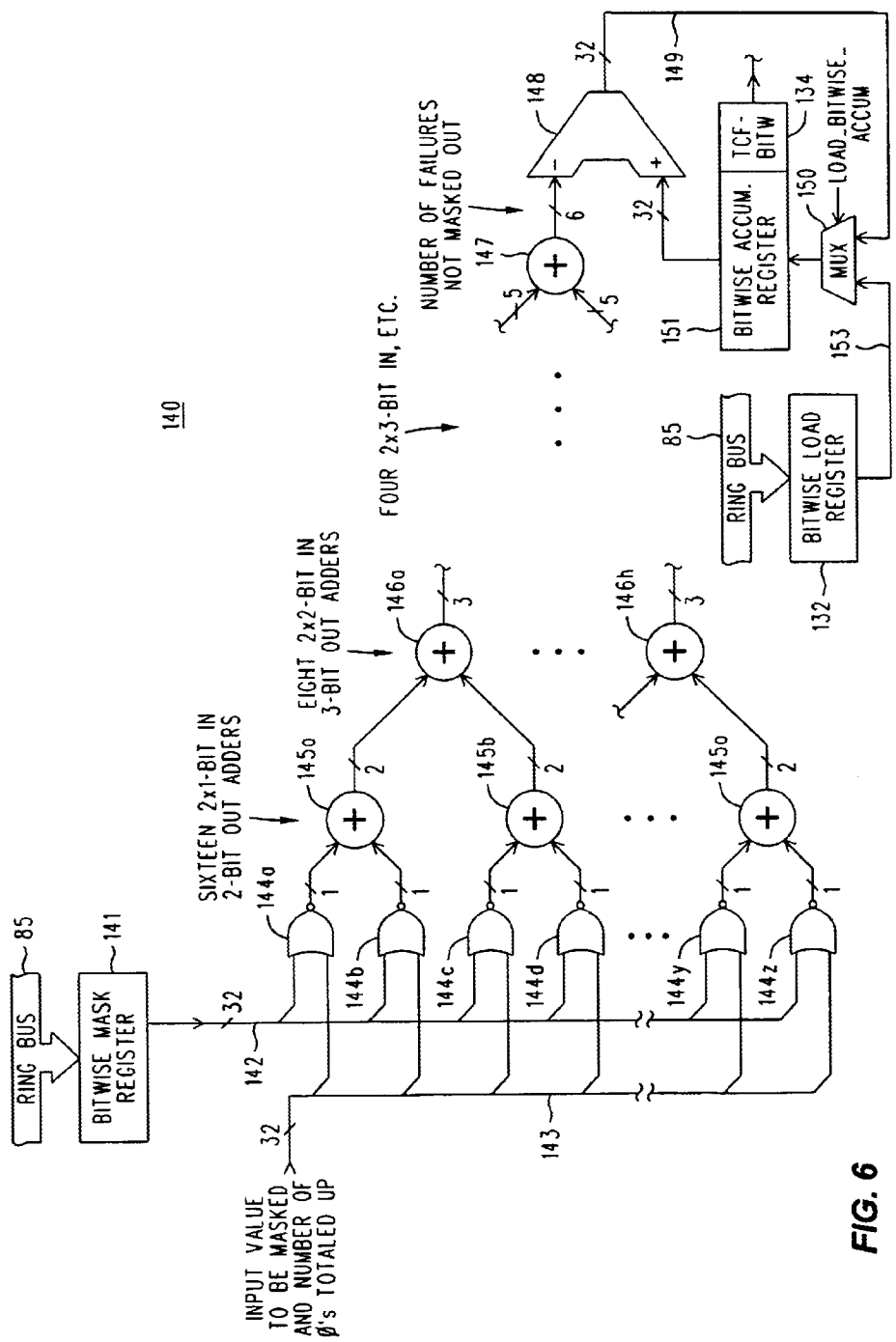
Figure 7:
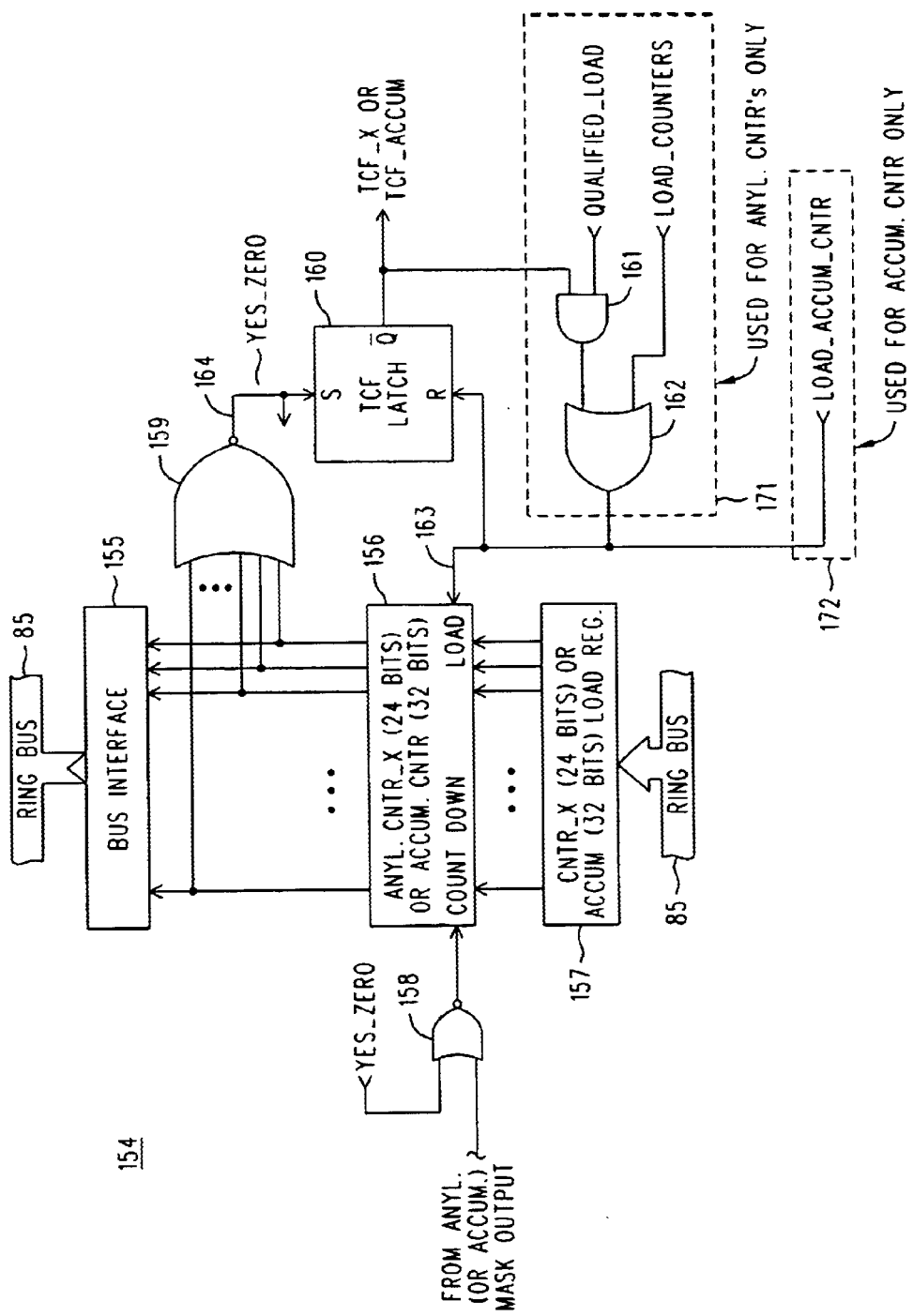

FIGS. 4A/B are a simplified block diagram of the Post Decode mechanism 60 of FIG. 2;

FIG. 5 is a block diagram of a mask circuit used in the block diagram of FIG. 4;

FIG. 6 is a block diagram of a mask and bitwise counter circuit used in the block diagram of FIG. 4; and FIG. 7 is a simplified block diagram of certain counter and terminal count flag circuitry used in FIG. 4B.

DESCRIPTION OF A PREFERRED EMBODIMENT

Figure 1:
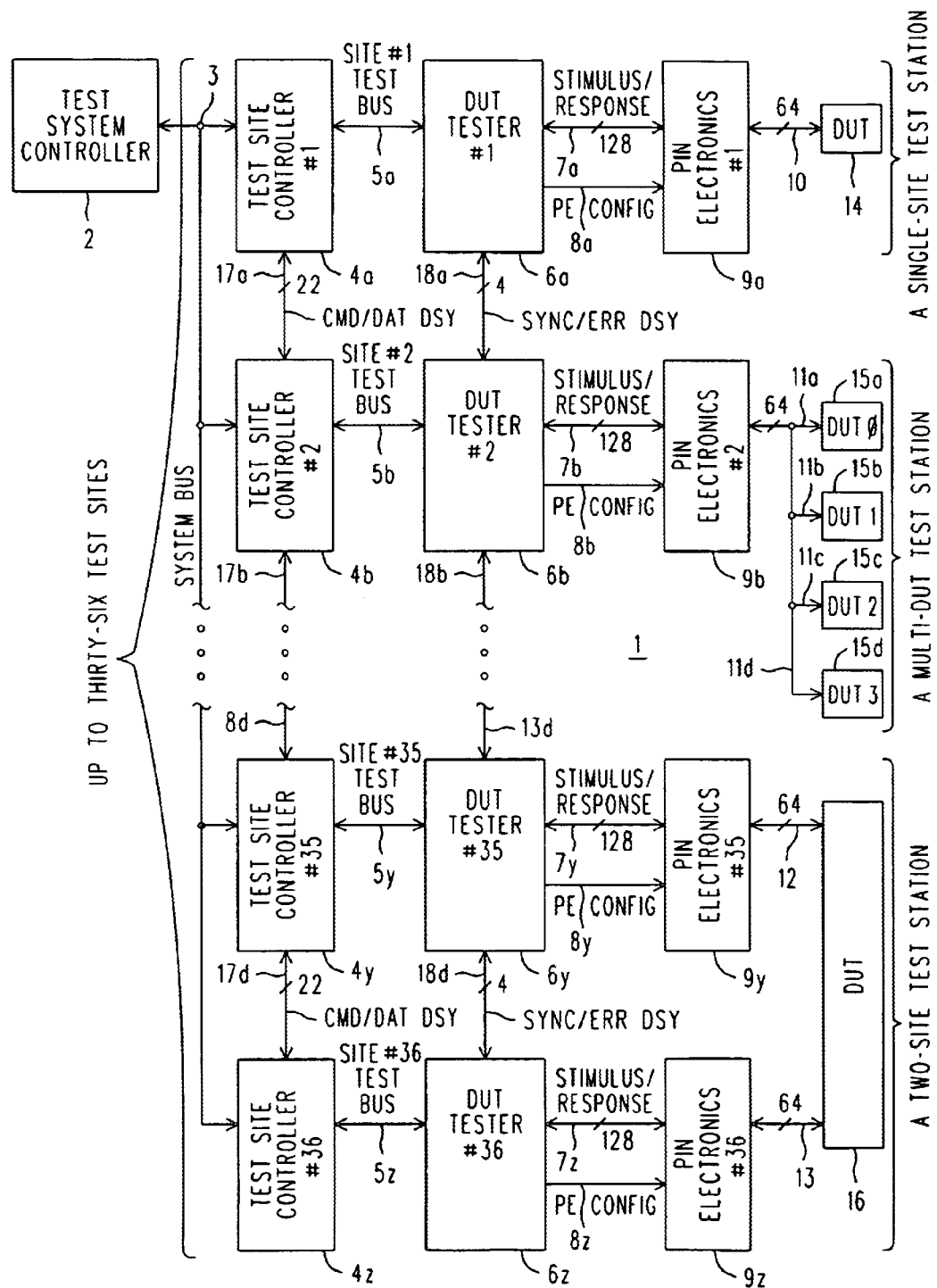
FIG. 1 is a simplified block diagram of an extensively reconfigurable non-volatile memory tester constructed in accordance with the invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

To briefly consider an opposing case, one should not assume that an entire Test Site is needed to test a single DUT, or that a single Test Site can test but a single DUT. Suppose that a wafer had two, three or four (probably, but not necessarily, adjacent) dies, the sum of whose test channel requirements were sixty-four channels or less. Such DUT's (15a–d) can be tested simultaneous by a single Test Site (e.g., Test Site #2 as shown in FIG. 2). What makes this possible is the general purpose programmability of each Test Site, as augmented by certain hardware features to be described in due course. In principle, a test program executed by the Test Site could be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. A major difference is, of course, individually keeping track of which of the two "component DUT's" pass or fail, as opposed to a simple unified answer for the "third" DUT. That is, there is an issue concerning what portion of the "third" DUT failed. There are other issues as well, including removing or limiting the drive signals to a bad DUT, branching within the test program based on which DUT indicates failure, while at the same time preventing the test program from becoming hopelessly multi-threaded. Certain simple aspects of this "Multi-DUT Test Station" capability at a single Test Site are fairly simple, while others are complex. Multi-DUT testing should not be confused with the notion of bonding two or more Test Sites together.

Were it not for this notion of Test Site reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were sometimes split to create more Test Stations for simple Multi-DUT testing (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, some as multi-DUT Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest O/S), which was also used in earlier products for testing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller #1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named (just as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester 6 is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes going to the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment, and chilled water is cheaper than air conditioning to remove the several tens of KW of dissipated heat for a fully loaded system), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master/slave relationships between various the Test Site Controllers. We shall denote these daisy chained style communication arrangements with the suffix noun "DSY", instead of "BUS". Thus, we might refer to a Command/Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts—the reader is invited to imagine that there are another ten subscript symbols in there, someplace.) A CMD/DAT DSY 17a (Command & Data Daisy Chain) interconnects the Test Site Controller 4a–4f that are in one card cage, while a different CMD/DAT DSY 17b interconnects the Test Site Controllers 4g–4m in another card cage. The same arrangement exists for the remaining card cages, and Test Site Controllers 4n–4t and 4u–4z, respectively. We have earlier said that the DSY do not leave the card cages, in that the "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17a–d that we have been discussing exist between the various Test Site Controllers 4a–4z. There is a similar arrangement for the SYNC/ERR DSY 18a–18d and the DUT Testers 6a–6z. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff; especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall NonVolatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Multi-Bus Controller 88 that converts traffic on the Test Site Bus to traffic on a Ring Bus 85 or a VT Bus 89. Ring Bus traffic can also converted to VT Bus traffic, and vice versa. Almost everything in FIG. 2 is part of some large scale integrated circuit; the Timing/Formatting & Comparison circuit 52 (described below) is actually eight such IC's, although we show it as one entity for the sake of brevity. Save for the various Ext. DRAM's (some of which are also part of the Interior Test Memory 87—see FIG. 3), most of the rest of the stuff in FIG. 2 is part of another large IC called the APG (Automatic Pattern Generator). The Ring Bus 85 is a general purpose inter-mechanism communication path for configuring the major elements within the APG portion of the DUT Tester 6, and for setting modes of operation, etc. There also various dedicated very wide and high speed paths between various elements of the APG. The VT Bus 89 is an IC to IC bus for use within the DUT Tester itself.

The Ring Bus 85 is the mechanism by which the Test Site Controller communicates with the APG portion of the DUT tester 6. The Ring Bus 85 is coupled to a Micro-Controller Sequencer 19, which may be likened to a special purpose microprocessor. Using an address created by a Next Address Calculator 102, it fetches instructions from a program stored in a program memory, which may be either internal to the Micro-Controller Sequencer 19 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is part of the large APG IC), so its size is limited. The external DRAM can be provided in adjustable amounts of considerable quantity, but is fast only when accessed in sequential chunks involving linear execution and no branching. Programming in the SRAM 20 is most often that which is intensely algorithmic, while the EXT. DRAM 21 is best suited for material not readily generated by algorithmic processes, such as initialization routines and random or irregular data.

The Next Address Calculator 102 can implement branching in the test program being executed, in response to unconditional jump instructions or conditional jump or conditional subroutine instructions conditioned on various PROGRAM CONTROL FLAGS (25), OTHER FLAGS (55), and certain other signals that, for clarity are shown separately (DFE 0:3 103 and DPE 0:3 104) and which are provided for multi-DUT operation.

The instruction word fetched and executed by the Micro-Controller Sequencer 19 is fairly wide:two hundred and eight bits. It consists of thirteen sixteen-bit fields. The fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address (created by Next Address Calculator 102) in ways familiar to those who understand about micro programmed execution mechanisms. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: PD_ERR 90. It is supplied to the PGM SRAM 20, originates with the Post Decode mechanism 60, and indicates that the Post Decode mechanism 60 has discovered an error. Another such additional flag is VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a Group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for-bottom) mirror image of another section of circuitry. This has the effect of rearranging what the bits mean, as far as what sequential address values are in physical order within that circuitry. This chip layout property may occur many times, and it may well be the case that how one Group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to various Buffer Memories and/or Tag RAM's 31 A–B and to Error Catch RAM 1/2 (32A/B), which, while having separate functions, may nevertheless be implemented as selectable partitions in the four Memory Sets that are collectively the Interior Test Memory 87. The mapped address output 30 is also applied as one input to an Addr. Bit Select circuit 37, whose multiplexing function is described in due course. The Interior Test Memory can be configured to contain many instances of various RAM-based memory structures used for different functions. This is accomplished by declaring that certain portions of the different Memory Sets are to be used for the associated purposes. What is shown in FIG. 2 is one such arrangement; arrangements can be changed as testing proceeds, and this whole business of Memory Set usage should be considered to be very dynamic. None of the inhabitants of the Interior Test Memory (e.g., the error Catch RAM's 32A–B) are permanent hardware fixtures. What is permanent are the four Memory Sets. But which part of which Memory Set is an Error Catch RAM at any given time (if indeed there is even one defined) is dependent on whatever configuration has been established.

Consider the Buffer Memories 31A and 31B. Their functions are to retain data patterns 33 and addresses 34 that can be applied to the DUT. These are actual separate outputs from their associated Buffer Memories, although these Buffer Memories are not a "dual port" memory, but are preferably composed of portions of two different Memory Sets. In keeping with this, it is preferred that Stored Data 33 is kept in one Memory Set, while Stored Addresses 34 are kept in another. Also, we have not shown an explicit mechanism for writing to a Buffer Memory. One way that may be accomplished is by an addressed bus operation initiated by a Test Site Controller 4 at the behest of the program it is executing. There is an "under the floorboards," as it were, "utility services" bus called the Ring Bus 85 that goes to just about everything in FIG. 2 (most of the visitations of which are not shown as that would clutter the drawing immensely). Another and faster way of writing information to the Memory Sets is described in connection with FIG. 3.

The Error Catch RAM's 32A—B are addressed by the same address that is applied to the Buffer Memories, and they either store or retrieve information about errors, which operations are performed in conjunction with a Post Decode Circuit, to be discussed later. As with the paths 33 and 34 from the Buffer Memories 31A–B, paths 62A–D (from the Error Catch RAM1 32A) are preferably MUX'ed outputs from a portion of a Memory Set (configured to operate as an Error Catch RAM), in accordance with configuration information distributed by the Ring Bus (not shown).

Note that the Data MUX 35 has as inputs the STORED DATA output 33 from the Buffer Memory 31A as well as data 28 from the registers DH and DL in the collection 24 of ALU's. The Data MUX 35 performs an initial selection, in accordance with values 36 stored in PGM SRAM 20, of which of these inputs (28, 32) to present as its output 38, which, unless modified as described next, is then applied as one of two vector components to a Transmit Vector Mapper/Serializer/Receive Vector Compare Data Circuit 40 (the other component is the output 39 of the Addr. Bit Select circuit 37).

Circuit 40 can perform three vector related functions: assemble vector components (38, 39) into an ordered logical representation of an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19.

Also contained within circuit 40 is a section of DUT Disable Logic 90. Its purpose is to respond to various conditions, some static, some contingent on test outcomes, but all defined programmatically, that indicate which one or more DUT's, among as many as four thereof, are to be disabled. These indications are carried by four signals DD 0:3 44b (DUT Disable for DUT Zero, for DUT One, etc.) This is in support of multi-DUT testing on a Test Site, and is further explained in the associated incorporated Application. The output of Circuit 40 is an up to sixty-four bit vector 44a that, along with the DUT Disable signals 44b, is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance (among the various Test Sites) of Pin Electronics 9 receives Transmitted & Received Vectors 7 and Pin Electronics configuration information 8 from its associated Timing/Formatting & Comparison circuit 52.

The Timing/Formatting & Comparison circuit 52 is coupled to the VT Bus 89 to receive configuration and control information. It will be recalled that the Timing/Formatting & Comparison circuit 52 is actually eight IC's, which for our purposes we are treating as a single entity.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54, but is locally addressed by an incremented counter that is not shown.) The Internal SRAM 54 (or external DRAM 53) assists in the production of Drive and Comparison cycles, which have associated formats. Drive cycles apply a transmit vector to the DUT using a pre-selected format supplied by one of RAM's 54 or 53. Comparison cycles receive a vector presented by the DUT and examine it, also according to a pre-selected RAM-supplied format, to determine if it matches previously supplied comparison data. Both Drive and Comparison cycles are adjustable as to their duration, and appropriately adjustable as to whether and when a load is applied, when data is latched or strobed, if a signal is Return-To-Zero or not, whether to surround a driven signal with its complement, etc. (These options are the various formats mentioned above.)

The comparison produced by the Timing/Formatting & Comparison circuit 52 includes information, on a per channel basis, about whether a channel failed because a logical value was wrong (a functional error) and/or because its electrical properties are outside acceptable limits (a parametric error). Furthermore, and as is explained in an incorporated Application, when multiple DUT testing is performed it is known which channels are associated with which DUT's. This allows the production of the four signals DFE 0:3 (DUT # Functional Error) 103 and the four signals DPE 0:3 (DUT # Parametric Error) 104.

The comparison performed by the Timing/Formatting & Comparison circuit 52 also produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60, and also to Error Catch RAM1 32A. At present, it is sufficient to say that the Post Decode circuit 60 can inspect via programmatic criteria both incoming error information 59 and error information previously stored in the Error Catch RAM1 32A to produce condensed and more readily interpretable error information which may then by stored back into the other Error Catch RAM2 32B via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

Figure 3:
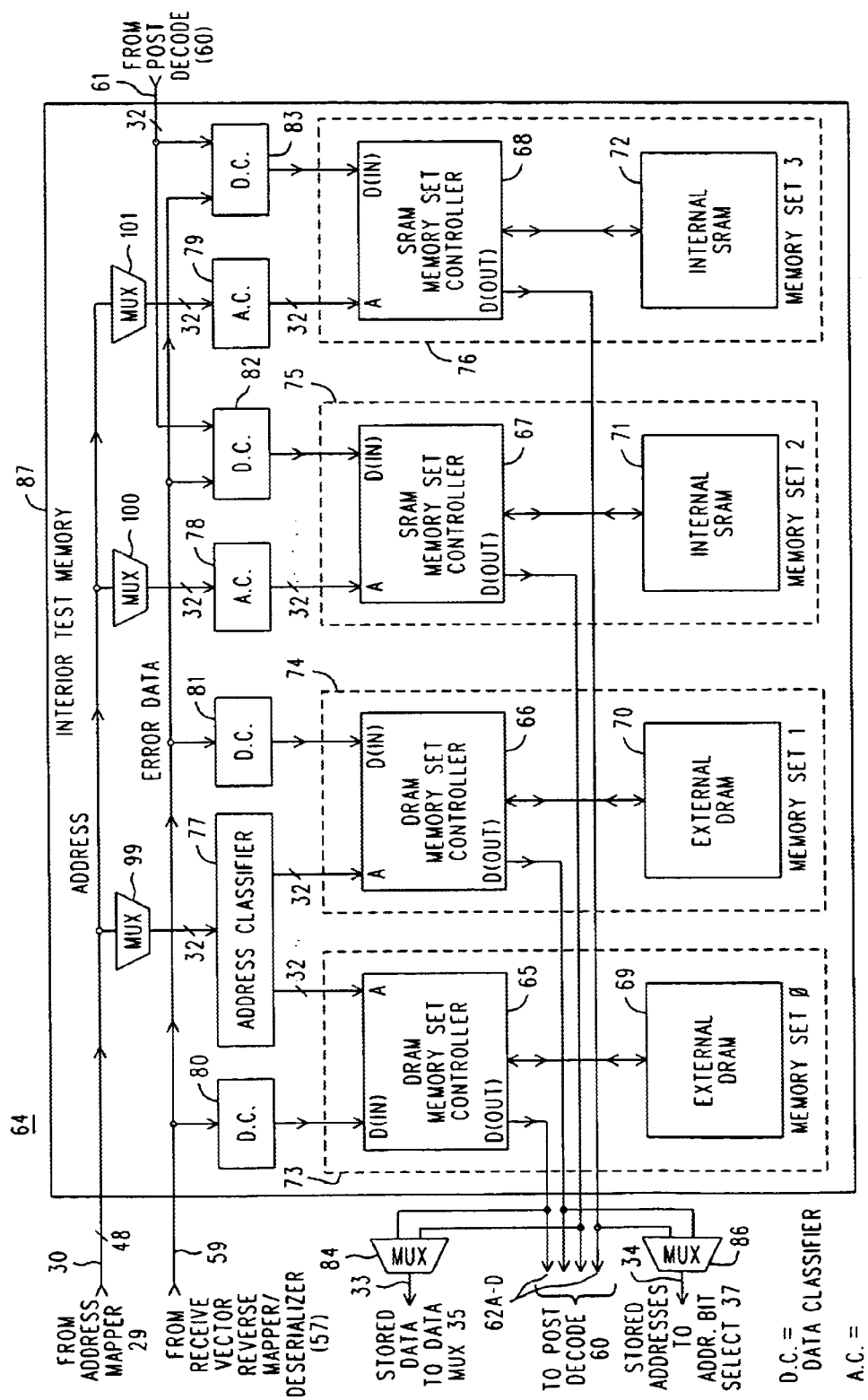
FIG. 3 is a simplified functional block diagram of the interior test memory mechanism that appears in the block diagram of FIG. 2.

Refer now to FIG. 3, which is a simplified block diagram 64 of the Interior Test Memory 87 in the block diagram of FIG. 2. It receives a forty-eight bit mapped address 30 from the Address Mapper 29, which is applied to various Address Classifiers 77, 78 and 79. The Address Classifiers are associated with Memory Sets 73–76, which are each complete memory mechanisms that can individually perform various functions, such as being an ECR 32. Two of these Memory Sets (73,74) are of external DRAM, while two are of internal SRAM. The two external DRAM Memory Sets will always have the same Address Classifier function in effect, and thus share one common Address Classifier 77. The internal SRAM Memory Sets 75 and 76 each have their own associated Address Classifiers, 78 and 79, respectively. These Address Classifiers can either pass an address through unchanged, or modify it in ways to be described in some detail in one of the incorporated Applications.

Each Memory Set includes a Memory Set Controller; the external DRAM Memory Sets 73 and 74 have DRAM Memory Set Controllers 65 and 66, respectively, while the internal SRAM Memory Sets 75 and 76 have respective SRAM Memory Set Controllers 67 and 68. During the testing of a DUT the address for memory transactions directed to any of these Memory Sets arrives at the associated Memory Set Controller from the respectively associated Address Classifier. All four Memory Sets can receive data directly over path 59, which is essentially the prior art path into interior test memory (which by-passes Post Decode 60). During the testing of a DUT Error Data 61 arriving from the Post Decode circuit 60 and that is to be written into Error Catch RAM2 32B is first applied to Data Classifiers 82–83, which are respectively associated with Memory Sets Two and Three. The Data Classifiers 80–83 may or may not change the data applied to them, depending upon how they are configured and the function they are to perform. The Address and Data Classifiers represent high speed paths for addresses and data, respectively, which are intended to operate at the highest speeds necessary. We shall shortly see that the Ring Bus (not yet shown) provides another way to convey addresses and data to the Memory Sets.

At this point we have four Memory Set Controllers (65–68) that each have incoming (classified) addresses and (classified) data. Each of these Memory Set Controllers is coupled to an associated memory: DRAM Memory Set Controllers 73 and 74 are respectively coupled to external DRAM's 69 and 70, while SRAM Memory Set Controllers 75 and 76 are respectively coupled to internal SRAM's 71 and 72. These arrangements constitute the four Memory Sets 73–76, two of which (75, 76) have modest amounts of high speed SRAM, and two of which (73, 74) have large amounts of slower DRAM. What is of interest to us at present is how the DRAM Memory Sets can be made as fast as the SRAM Memory Sets, as well as how to incorporate certain alternatives concerning configuration of the DRAM, depending upon user preference and test program strategy. Thus, it is going to turn out that the DRAM Memory Set Controllers 65 and 66 are configurable, perform different types of memory transactions, and are not altogether the same as the simpler SRAM Memory Set Controllers 67 and 68. For the sake of brevity, FIG. 3 does not show the structure that provides this flexibility; for now let's just say that each Memory Set Controller is connected to the Ring Bus (not yet shown), from which it is instructed in the particular mode of operation and configuration that are desired. Some of these modes involve how data is stored, and some have to do with getting it back out again. To conclude, then, note that each Memory Set does have an associated Data Out (62A–D) which is sent to the Post Decode Mechanism 60 for further processing. Note also that the data outputs from Memory Sets zero and two are applied to a MUX 84 whose output becomes STORED DATA 33 that is sent to Data MUX 35. Similarly, the data outputs from Memory Sets one and three are applied to a MUX 127 whose output becomes STORED ADDRESSES that are sent to the Addr. Bit Select MUX 37. The reason for having MUX's 84 and 86, and the details of how they are controlled are not of particular interest here; they are discussed in the incorporated Applications.

Now consider FIGS. 4A/B, which are a simplified block diagram 91 of the Post Decode circuit 60 of FIG. 2. Beginning with FIG. 4A, and consistent with what is shown in FIG. 2, there are two data paths that serve as inputs into the Post Decode mechanism 60. These are the single source 59, from the Receive Vector Reverse Mapper/Deserializer (57), and the four sources 62A–D from interior test memory 87 for some one Memory Set configured to operate as an ECR (which we have depicted as Error Catch RAM1 32A, or ECR1. Of the four sources 62A–D, only one (active) ECR will be in any single Memory Set at one time. All five sources are applied to a MUX 94, which selects one thereof as the input to be applied to various Input Masks (96, 97, 105, 107) and to a MUX 108 that selects between the output of MUX 94 and the outputs of those various Input Masks.

We use the term "mask" in its conventional manner, to denote a pattern and an associated mechanism to remove or include selected bits in a data field thereof from some type of consideration. The mask pattern has the same number of bits as the data field of interest, and is considered to be in one-to-one correspondence therewith. In our case we use a mask that has ones in locations that are to be ignored, or "masked out" from consideration. The data field will follow our usual convention of representing failures with zeros. The "consideration" of interest will generally be the presence of any, or the number of, zeros in the data field remaining after the mask has been applied. The circuitry that does the actual masking will be described later. For now, we shall simply treat the masking operation on the block diagram level as we consider the general nature of FIGS. 4A–B. The block diagram property of an Input Mask is that it will set a "masked out" bit position to a 1, so that it will not contribute to representing any failures.

To continue then, consider Jam Mask Register 93, and note that is coupled to the Ring Bus 85 for the purpose of receiving a thirty-two bit mask value. That mask value is applied to Input Mask 96, while its bitwise complement is applied to Input Mask 97 by action of inverters 98. These masks are constant for a duration of a given pattern. That is, they are not expected to routinely change from one data value to the next. The Input Masks themselves receive as input data the source selected by MUX 94, according to the signal ERR_DATA_SEL, which in turn originates with a PD Control Register 92 also connected to the Ring Bus 85. The outputs of the Input Masks 96 and 97 are then applied as additional inputs to MUX 108.

MUX 108 receives two more masked inputs. These are the outputs of Input Masks 105 and 107, whose inputs are also the output of MUX 94, and whose masks are also complementary by action of inverters 106. In this case, however, the source of the mask value is expected to be a Buffer Memory, as selected by MUX 95 and the MUX control signal BM_SEL. To this end, note that MUX 95 has as inputs the four sources 62A–D. This arrangement allows the masks used by Input Masks 105 and 107 to change on a cycle by cycle basis as a pattern is running.

It will now be appreciated that what is presented as inputs to MUX 108 are four variously masked versions of the addressed data and one unmasked version of that data. Which of these five versions is selected by MUX 108 and sent on as masked data 114 is determined by MUX control signal PD_MASK_MODE.

The three MUX control signals mentioned so far (ERR_DAT_SEL, BM_SEL, PD_MASK_MODE), as well as one more to be introduced later (PD_ERR_SEL), are all produced as outputs from the PD Control Register 92, according to how its contents are set by traffic directed to it over the Ring Bus 85.

Now have a look at FIG. 4B. This rather busy drawing is not as bad as it looks. Consider the upper left-hand quadrant of the figure. Thereat are represented thirty-two instances of Analysis Mask and Analysis Counter mechanisms. Let us consider what that stuff is all about.

To begin, the Analysis Masks (ANYL. MASK_0 . . . ANYL. MASK_31, 110a–z) have at the block diagram level the property that they produce a single bit output that indicates with a zero that one or more of the unmasked data bits was a zero, and a one if there were no failure indications (zeros) among the unmasked bits. The mask used by each mask circuit 110a–z is supplied by an associated MASK_0 . . . MASK_31 REGISTER (109a–z) that is coupled to the Ring Bus to receive its value. Now note two things. First, the output of the Analysis Mask circuits 110a–z are sent to corresponding Analysis Counters (ANYL. CNTR_0 . . . ANYL. CNTR_31, 112a–z). These counters count the zeros sent thereto, and can be used to total up the number of times (during a pattern, say) an error is revealed by the associated mask. Second, all thirty-two of the masked outputs are collected into a set 113 thereof, so that they may be either stored in an ECR (via path 61) or further analyzed by a PD Error Mask 120.

To continue, the Analysis Counters 112a–z have the following block diagram properties. They count down from a pre-loaded value given them by what is stored in corresponding Load Registers (CNTR_0 LOAD REG. . . . CNTR._31 LOAD REG., 111a–z), which in turn are all separately set by traffic individually directed to them over the Ring Bus. That allows the counters to be preset with a threshold value, from which they count down. When they reach zero a corresponding Terminal Count Flag (TCF_0 . . . TCF_31, 115a–z) exerts a zero, and further counting down is inhibited (the counters get stuck at zero). They will remain zero until they are reloaded with a threshold value by action of a signal LOAD_COUNTERS, which will force a reload any time it is exerted. There is also a QUALIFIED_LOAD signal that will reload each of the counters 112a–z from their respective registers 111a–z, provided a counter is not already zero, in which case its individual reload is inhibited.

Note that the various Terminal Count Flags 115a–z are collected as 116 and applied as the alternate input to MUX 118, alongside collection 113 from the Analysis Masks 110a–z. The collections 116 and 113 are also applied to a MUX 117, from whence the selected one thereof can be stored in a Buffer Memory via path 61. The selection for both MUX 117 and MUX 118 is made by the control signal PD_ERR_SEL, which originates with PD Control Register 92.

To continue with the rest of FIG. 4B, it will be appreciated that the Analysis Mask and Analysis Counter mechanism just described allows a wide variety of error conditions to be detected and counted, with indications produced about counts exceeding preselected thresholds. The state of affairs existing at the outputs 113 and 116 can be stored in memory via MUX 117 and path 61. That same state of affairs is also subject to further analysis via MUX 118 and PD Error Mask 120, which is an Input-style mask whose mask is contained in Error Mask Register 119, as set by the Ring Bus. The thirty-two bit output 121 of the PD Error Mask 120 is applied to NAND gate 122, where it is essentially OR'ed with two other zero-is-error signals: the outputs of gates 129 and 136. These latter signals will be discussed in due course. The OR thus produced is rendered as a one-means-exerted signal PD_ERR 90 that is applied to the MICROCONTROLLER SEQUENCER 119.

The masked data 114 is also applied to two other mask/counter structures shown in the bottom of FIG. 4B. Consider the ACCUM. ANYL. MASK 123 (whose mask is contained by ACCUM. MASK REG. 124, as set by the Ring Bus). It operates the same way as any of masks 110a–z. Its output is applied to an ACCUM. CNTR. 126 that also counts down when it is supplied a zero by its mask 123, and is preset to a threshold value by ACCUM. LOAD REG. 125 when the signal LOAD_ACCUM_CNTR is exerted. The threshold value in register 125 is supplied by the Ring Bus. The output of the counter 126 can count down to zero, whereupon it causes the Terminal Count Flag TCF_ACCUM 127 to exert a zero and the counter itself gets stuck at zero until reset. To this point the structure of items 123–127 is essentially identical to what we have already described in connection with the Analysis Masks and Analysis Counters. The difference is in how the results can be output, and in what the mask is intended to be. The items 123–127 are intended to accumulate the number of whole words having errors, and compare that against the desired threshold. To continue, the signal TCF_ACCUM from 127 is applied to a one bit mask comprised of one bit latch A_Latch 128 and OR gate 129. The output of OR gate 129 indicates, with zero-means-detected failure logic, if the threshold was met, and is another input in the production of PD_ERR 90.

There is one more mask and accumulate mechanism in FIG. 4B. BITWISE ANYL. MASK 130, BITWISE MASK REG. 131 and BITWISE LOAD REG. 132 are the same as their previously explained obvious counterparts (say, 123–125). The only difference to this point is that the load signal for the register 132 is its own individual signal LOAD_BITWISE_ACCUM. A difference now arises in the block diagram properties, in that the latch BITWISE ACCUM. 133 is not a mere counter like the others. It counts the number of zeros reaching it within each mask result after the masking operation, and it accumulates these as a decrementing quantity against an initial threshold in register 132. When the threshold is reduced to zero the flag TCF_BITW of latch 134 is exerted low. Similarity is once again resumed with a one-bit mask comprised of B_LATCH 135 and OR gate 136, whose output is the final contributor to the production of PD_ERR 90 by NAND gate 122.

We conclude our overview of the Post Decode mechanism 60 with a brief discussion of the function of the 4-Bit Write Only Register 137, located in the upper right-hand corner of FIG. 4B. It is set by the Ring Bus, and when one of its output bits is clocked through as TRUE (a one) it of course exerts itself as the associated named control signal. We have already encountered these, and they are the various LOAD signals used by the counters we described above. The idea here is to fix it so these LOAD signals do their thing and then go away, as it would be extremely dysfunctional for them to persist. To this end, OR gate 130 detects that one or more of these LOAD signals is true, and supplies that to an AND gate 139 which, when the next clock cycle occurs, resets the contents of register 137 to all zeros. It's a one-shot type of mechanism.

Finally, and although we have not shown it yet (it's in FIG. 7), the values of the various counters can be read out onto the Ring Bus.

Refer now to FIG. 5, wherein is shown a block diagram 165 describing the way the various masks work. An Input Mask consists of a thirty-two bit input data value 166 and a thirty-two bit mask value 167. The mask value 167 might come from a register (be static) or it might be more transitory, such as mask data read from memory. In any event, there is a bit-wise OR'ing by gates 168a–z between the two items 166 and 167. The resulting thirty-two bit quantity 169 is the output for an Input Mask. For an Analysis Mask, quantity 169 is applied to an AND gate 170 that produces a zero at its output if any bit in quantity 169 is a zero.

The nature of the BITWISE ACCUMULATION mechanism 133 may be appreciated with reference to FIG. 6, which is a block diagram 140 of that circuitry. It contains a mask register 141 whose thirty-two bit value 142 is bitwise NOR'ed with a thirty-two bit input data value 143. The difference so far with the mask arrangement of FIG. 5 is that gates 144a–z are NOR gates instead of OR gates. The effect of this change is to produce ones instead of zeros for failures surviving the masking. This is so the occurrences of the failure indications may be more readily summed into a total. They are added by grouping NOR gates into pairs and applying the outputs of those pairs of NOR gates to adders 145a–o. Adders 145a–o are themselves paired and their outputs applied to yet other adders 146a–h. In this way the total number of zeros in input value 143 is piecewise accumulated, until it is available at the output of adder 147. Now it is used to decrement a value that started out as threshold value in BITWISE LOAD REGISTER 132, which by an initial exertion of the MUX control signal LOAD_BITWISE_ACCUM to MUX 150, got into BITWISE ACCUM. REGISTER 151. Now, it is arranged that the value in register 151 be diminished by the output of adder 147. This is accomplished by subtraction circuit 148, whose output is then routed through MUX 150 to become the next value stored in register 151. The effect is to count register 151 down by sums produced by adder 147. When register 151 passes through zero the Terminal Count Flag mechanism 134 exerts a zero.

FIG. 7 shows a block diagram 154 illustrating the nature of the Analysis and Accumulation Counters 156 described above. Analysis Counters and their Load Registers (157) are of twenty-four bits, while those items for Accumulation use are of thirty-two bits. In any event, a zero to be counted from the mask is applied to NOR gate 158, whose other input is a signal YES_ZERO 164. YES_ZERO is produced by a NOR gate 159 driven by the (true) outputs of the counter 156, and whose job it is to produce YES_ZERO=ONE whenever the content of the counter 156 is zero. YES_ZERO does two things. First, it inhibits further counting by forcing the output of NOR gate 158 to zero, regardless of the input from the mask. The counter 156 actually counts ones, so it no longer counts. Second, YES_ZERO sets the TCF Latch 160, whose NOT-Q output then goes to zero.

For an Analysis Counter, the TCF signal going to zero operates through AND gate 161 to inhibit the action of the signal QUALIFIED_LOAD. That keeps the reload of register 156 from occurring, as mentioned earlier. If QUALIFIED_LOAD is not inhibited, it passes through to OR gate 162, where either QUALIFIED_LOAD or LOAD_COUNTERS will cause a LOAD of counter 156 with the value in register 157 and will also reset the TCF LATCH 160. This is an indicated by the circuitry inside the dotted line 171.

For the Accumulation Counter the stuff inside dotted line 171 is replaced by the simple arrangement shown with dotted line 172. In that case the signal LOAD_ACCUM_CNTR is applied directly to LOAD the counter 156 and RESET the TCF LATCH 160.

Note that the output of the counter 156 is applied to a Bus Interface 155, from which its value may be sent over the Ring Bus.

Several desirable features for a Post Decode mechanism were set out in the Summary. Here now, is a brief explanation of how the subject matter of FIGS. 4A/B, 5, 6 and 7 can be employed to accomplish those desirable ends. The "analysis on the fly" feature of the enhanced Post Decode mechanism is accomplished by path 59 being connected to MUX 94. This allows analysis to proceed without having to previously store test results in the interior test memory.

The ability to do analysis on the fly, coupled with being able to use the contents of a Buffer Memory as a mask that can change from applied address to address, combine to facilitate a feature that allows only new errors to be recognized. In the Summary this was termed "incremental Post Decode analysis." The idea is to accrue error data in an ECR during an earlier test, copy that error data over to a Buffer Memory, and then use that Buffer Memory as a mask to obscure old errors during a new test, allowing only new errors to be recognized and further processed. This feature is supported by the coupling of paths 62A–D to MUX 95. It is also supported by the inverters 106 coupled to Input Mask 105, as these inverters allow the zero-indicates-failure format to be inverted into the logic ones that will indicate bit positions that are to be obscured by the mask. During an initial first test, however, it is desirable to use a mask of all zeros in Jam Mask Register 93 in conjunction with Input Mask 96 and with MUX 94, in order to allow unmasked capture for the first pass of the test. After that, the incremental mode of operation using MUX 95 in place of MUX 94 can commence.

The incremental analysis mechanism described above relies upon being able to copy from an ECR to a Buffer Memory. The memory system that is the interior test memory does not, by itself, provide a means to perform such a copy operation. It can be done, however, with the aid of the enhanced Post Decode mechanism described above. In particular, there is a path for unaltered data transmission that starts with any one of paths 62A–D and ends with path 61. That unaltered path starts with MUX 94, thence to MUX 108, proceeds via a proper configuration of Analysis Masks 110a–z, and ends along path 113 to MUX 117. The proper configuration of the Analysis Masks 110a–z is for each to have a mask of all ones, except for the bit position corresponding to the mask number, which will be a zero. (This seemingly strange condition follows from the fact that each Analysis Mask only outputs a single bit, and arranges for the plurality of those masks to pass the data without altering it.)

The enhanced Post Decode mechanism 60 can, in some cases, perform simultaneous analyses. For instance, the collection of Analysis Masks 110a–z can be performing its tasks(s) at the same time that each of the Accumulation Analysis mechanism (123–129) and the Bitwise Analysis mechanism (139–136) are independently performing their tasks. What makes this possible is that each of these mechanisms is independently and simultaneously exposed to the data 114.

It will be appreciated that the Accumulation Analysis mechanism (123–129) operates on the undifferentiated presence or absence of errors within a data word appearing on path 114. That is, the existence of one or more errors within a data word is treated the same as a single error. In contrast, the Bitwise Analysis mechanism (130–136) is responsive to the actual number of errors within a data word appearing on path 114.

Finally, note that the collected values of the Terminal Count Flags (116) are applied to MUX 117, from whence they may be logged to a Buffer Memory via path 61. Here is an example of why this feature can be useful. Suppose that an ECR has been configured to operated as a Z (i.e, block) TAG RAM. It is desirable to have individual thresholds for errors associated with each block. To do this, one would log the Terminal Count Flags to the ECR for each block address and then reset the Analysis Counters between blocks. The logged information indicates blocks that exceed their thresholds.

We claim:

1. A method of analyzing test results for a memory under test on a memory tester, the method comprising the steps of:

(a) performing a test operation on a memory under test to produce a data result;

(b) absent prior storing of that data result in a work location, applying a mask to the data result, and then;

(c) activating a counter according to error indications remaining in the data result after the application of the mask.

2. A method as in claim 1 further comprising the steps of comparing the content of the counter to a threshold value and generating an error signal when the threshold is met.

* * * * *